United States Patent [19]

Kliman et al.

[11] Patent Number: 4,896,089
[45] Date of Patent: Jan. 23, 1990

[54] FAULT MANAGEMENT SYSTEM FOR A SWITCHED RELUCTANCE MOTOR

[75] Inventors: Gerald B. Kliman; Stephen R. MacMinn, both of Schenectady; Charles M. Stephens, Pattersonville, all of N.Y.

[73] Assignee: General Electric Company, Schenectady, N.Y.

[21] Appl. No.: 304,159

[22] Filed: Jan. 31, 1989

[51] Int. Cl.$^4$ ............................................... H02P 8/00
[52] U.S. Cl. .................................... 318/701; 318/254; 318/430; 318/696
[58] Field of Search ............... 318/138, 254, 430, 434, 318/696, 701, 706, 707

[56] References Cited

U.S. PATENT DOCUMENTS

| | | | |
|---|---|---|---|
| 4,196,462 | 4/1980 | Pohl | 318/430 X |
| 4,208,868 | 6/1980 | Regnier et al. | 318/430 X |
| 4,434,389 | 2/1984 | Langley et al. | 318/254 |
| 4,578,623 | 3/1986 | Tsukutani et al. | 318/254 |
| 4,595,865 | 6/1986 | Jahns | 318/254 |
| 4,625,158 | 11/1986 | Taenzer | 318/701 |

*Primary Examiner*—Bentsu Ro
*Attorney, Agent, or Firm*—Jill M. Breedlove; James C. Davis, Jr.; Marvin Snyder

[57] ABSTRACT

A fault management system for a switched reluctance motor detects faults through phase current differential sensing and phase flux differential sensing and isolates any fault by deactivating any faulted phase. Motor operation continues through the remaining phases. A speed control circuit maintains the normal operating speed of the motor, despite the deactivation of one or more phases. Starting the motor when stopped in a "dead zone" created by a faulted phase is accomplished by using the intact phases to generate negative torque to move the rotor out of the dead zone.

36 Claims, 7 Drawing Sheets

FAULT MANAGEMENT SYSTEM FOR A SWITCHED RELUCTANCE MOTOR

FIELD OF THE INVENTION

The present invention relates generally to fault tolerance in motor drives More particularly, this invention relates to a fault management system for detecting and isolating faults in a multiphase motor so that the faulted motor phases are deactivated and normal motor operation is continued.

BACKGROUND OF THE INVENTION

Variable reluctance motors are multiphase motors which have tooth-like poles on both the stator and the rotor. There are windings on the stator, but no windings on the rotor. Each pair of diametrically opposite stator windings is connected in series to form one phase of the motor.

Torque is produced by switching current on in the phases in a predetermined sequence so that a magnetic force of attraction results between the rotor and stator poles that are approaching each other. The current is switched off in each pair of windings at a point before the rotor poles nearest the stator poles having that pair of windings rotate past the aligned position; otherwise the magnetic force of attraction will produce a negative or braking torque. The torque developed is independent of current direction. Therefore, unidirectional current pulses synchronized with rotor movement can be generated in a converter using unidirectional current switching elements, such as thyristors or transistors, in each leg of the converter. The current pulses are supplied to the corresponding phase of the motor.

Each time a phase of the motor is energized by closing switches in the converter, current flows in the pair of stator windings of that phase, providing energy from a DC supply to the motor. The energy drawn from the supply is partially converted into mechanical energy by causing the rotor to rotate towards a minimum reluctance configuration. Some of the remainder of the energy produced by the supply is converted into stored energy in the magnetic field, while some is dissipated as core and winding losses. When the switch is opened, part of the stored magnetic energy is converted to mechanical output, and the remainder of the stored magnetic energy is preferably returned to the DC supply by means of a flyback diode pair or other circuitry.

The motor may be run open-loop as in a variable reluctance stepping motor, or may be run closed-loop as in a switched reluctance motor. Furthermore, the motor may be operated such that no two phases are conducting simultaneously (i.e. non-overlapping conduction intervals) or such that some phases do conduct simultaneously (i.e. overlapping conduction intervals).

Current regulators are employed for limiting the phase current amplitudes in a variable reluctance motor. There are several types of current regulators. For example, individual low-resistance current shunts may be coupled to each phase winding to detect the current level in each phase. The output of each current shunt is connected to a separate voltage comparator. Each comparator is also connected to a separate potentiometer for setting the current limit.

Another type of current regulator is disclosed in U.S. Pat. No. 4,595,865 issued to T. M. Jahns on June 17, 1986 and assigned to the instant assignee The cited patent is hereby incorporated by reference. In the current sensing scheme of the above referenced patent, a single voltage comparator performs the current regulation function for an entire power converter. The comparator generates a low logic level whenever any instantaneous phase current exceeds a regulated current limit. Sensor means, which may comprise a plurality of series-connected diode pairs or diode-thermistor pairs, provides voltage signals to the comparator, the voltage signals being proportional to the instantaneous phase current of a respective phase.

Other types of suitable current sensors are well-known in the art, such as: Hall effect current sensors; sensing resistors; sensing transformers; and current sensing transistors, such as those sold under the trademark SENSEFET by Motorola Corporation or those sold under the trademark HEXSense by International Rectifier.

In a typical switched reluctance motor, pole excitation windings on directly opposite stator poles are connected in series aiding to achieve balanced magnetic and mechanical operation. In particular, leakage flux is minimized for maximum utilization of the available ampereturns, and the radial magnetic forces on the rotor cancel, thus resulting in minimum shaft deflection and vibration. Therefore, there are effectively a number of separate circuits equal to one-half the number of stator poles, the circuits being spatially, ohmically, and magnetically isolated from each other. The present invention utilizes the characteristic independence of the motor phase circuits as the basis for a fault-tolerant drive scheme. Such a fault-tolerant motor drive would be particularly useful in aerospace applications, including fuel pumps and electric generators and the like, for which a motor should continue operating, and also be startable, in spite of a phase fault. Another exemplary application is in automotive power steering.

OBJECTS OF THE INVENTION

It is, therefore, an object of the present invention to provide a fault management system for a multiphase motor employing unidirectional current excitation from a DC source, whereby the fault management system detects and isolates faults in order that the faulted motor phases are deactivated and uninterrupted motor operation continues.

Another object of this invention is to provide a fault management system for a multiphase variable reluctance motor which limits propagation of any damage by deactivating any faulted motor phases, while continuing operation of the motor.

Still another object of the present invention is to provide a fault tolerant drive system which maintains the normal operating speed of a multiphase variable reluctance motor despite the existence of deactivated, faulted phases.

Yet another important object of this invention is to provide a method for starting a multiphase variable reluctance motor when the rotor is stopped in a position or dead zone such that a faulted phase prevents the production of positive torque by the remaining phases for rotation in a specified direction.

SUMMARY OF THE INVENTION

These and other objects are achieved in a new fault management system for a multiphase motor employing unidirectional current excitation from a DC source. The new system comprises current sensor means, current differential sensor means, and flux differential sensor means. Acting upon signals from these sensor means, a control circuit isolates motor faults and deactivates the corresponding faulted phase or phases. Motor operation thus continues through excitation of the remaining phases. In the preferred embodiment, a speed control circuit maintains the normal operating speed of the motor, despite the deactivation of one or more phases.

The current sensor means preferably comprises well-known apparatus for regulating phase current, such as those above discussed. In addition to regulating phase current, however, the current sensor means is further employed in the present invention to detect abnormally high phase currents that could result from a fault condition and to measure the frequency of current regulation switching which likewise could be indicative of a fault condition.

The current differential sensor means preferably comprises a toroidal magnetic core surrounding the two leads of a motor phase winding. In normal, no-fault operation, the current in both leads is the same, and no flux is induced in the magnetic core. In contrast, some motor faults cause different currents to flow in each lead of a motor phase winding. This current difference induces a flux in the magnetic core. The flux is detected by a sensor winding wound around the core. A low logic level signal from the current differential sensor means to the control circuit results in deactivation of the faulted motor phase.

The flux differential sensor means comprises an additional phase winding for each motor phase including a few turns of fine wire wound around each stator pole of the respective motor phase, but connected in series opposition. When a fault results in a different flux in each stator pole of the respective motor phase, a voltage will be induced across the additional winding, hereinafter the flux differential sense coil pair, and the resulting low logic signal supplied to the control circuit results in deactivation of the faulted motor phase.

The preferred embodiment of the present invention also includes a rate-of-rise sensor means for detecting an abnormally large increase in phase current per unit time which occurs when a portion of a phase winding is bypassed. The rate-of-rise sensor means detects essentially the same faults as the flux differential sensor means and, therefore, may be used in lieu thereof or in conjunction therewith.

Additionally, the preferred embodiment of the present invention comprises a speed controller which maintains the normal operating speed of the motor, despite the deactivation of faulted phase(s).

Still further, the present invention includes a method for starting a multiphase variable reluctance motor when the rotor is in a "dead zone"; that is, when the position of the rotor is such that a faulted phase prevents the generation of positive torque by the remaining phases in a specified direction.

The features and advantages of the present invention will become apparent from the following Detailed Description of the Invention when read with the accompanying drawings.

DETAILED DESCRIPTION OF THE INVENTION

Figure 1:
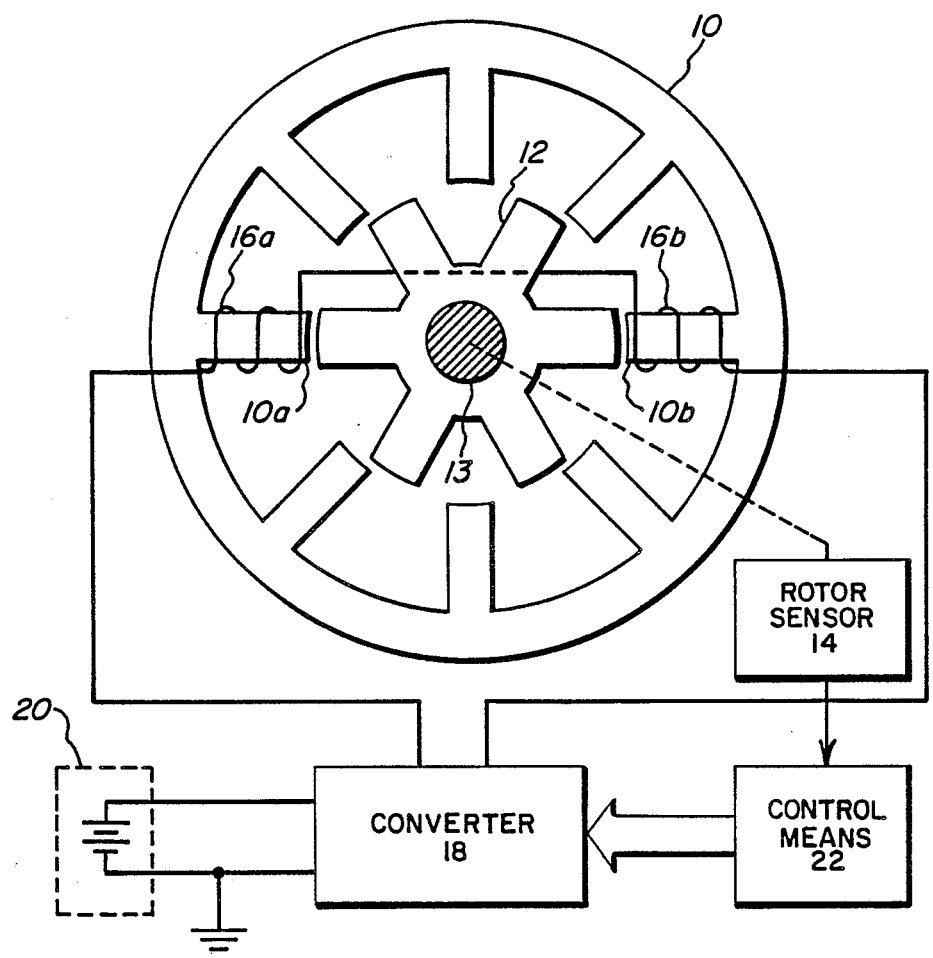
FIG. 1 is a schematic illustration of a conventional switched reluctance drive.

FIG. 1 shows a switched reluctance drive of a type which may beneficially employ the fault management system of the present invention. The drive includes a laminated iron stator 10 which has a plurality of stator pole pairs including a pair comprised of stator pole 10a and stator pole 10b. A laminated iron rotor 12 has a plurality of rotor pole pairs, the number of rotor pole pairs being less than the number of stator pole pairs. Rotor 12 is fastened to a shaft 13 and drives a rotor position sensor 14.

A motor phase winding comprising phase windings 16a and 16b wound on stator poles 10a and 10b, respectively, is connected to a converter 18. Other windings (not shown) on the remaining stator pole pairs are likewise connected to the converter, which is driven by a DC source 20, such as a battery or a rectified AC source. A control means 22 receives a rotor position signal from rotor position sensor 14 and provides firing signals to converter 18 for energizing the phase windings in a predetermined sequence. Rotor position may alternatively be determined indirectly, by sensing back electromotive forces (EMF) in the motor, for example.

Figure 2:
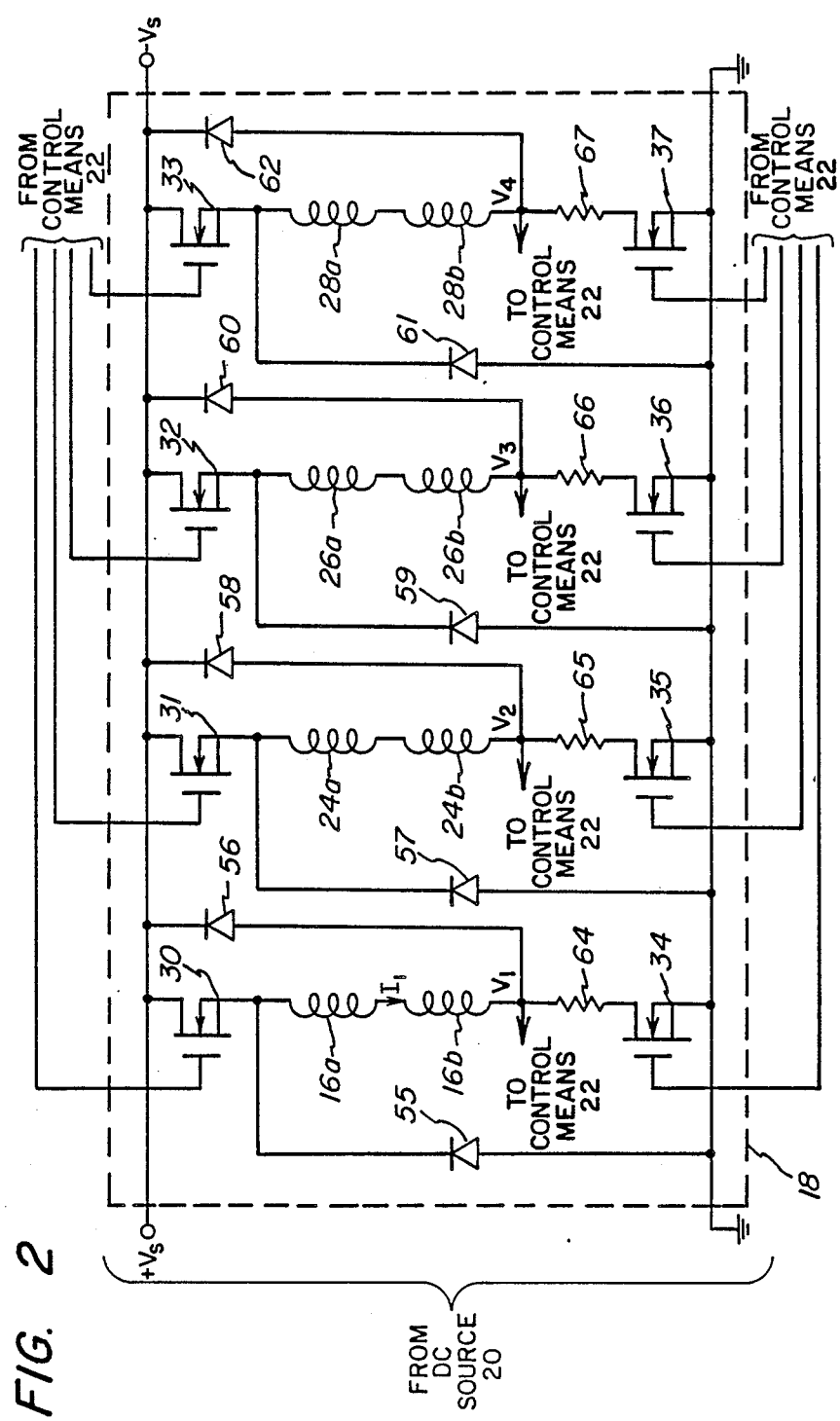
FIG. 2 is a schematic diagram of a power converter for a switched reluctance drive.

The preferred embodiment of converter 18 is shown in FIG. 2. Motor phase windings 16a, 24a, 26a and 28a are each respectively connected in series with an upper switch 30-33, respectively, while motor phase windings 16b, 24b, 26b and 28b are each respectively connected in series and with a lower switch 34-37, respectively. Motor phase windings 16a, 24a, 26a and 28a are also each respectively connected in series with motor phase windings 16b, 24b, 26b and 28b, respectively. The upper and lower switches each comprise a field-effect transistor (FET) across DC source 20. Each phase winding 16a, 16b, 24a, 24b, 26a, 26b, 28a, 28b is coupled to the DC source by flyback or return diodes 55-62, respectively. At the end of each conduction interval of each phase, stored magnetic energy in the respective motor phase winding is returned to the DC source through the respective one of these diodes connected thereto.

Semiconductor switches 30-37 are shown in FIG. 2 as FETs, but other devices may be used such as bipolar transistors, silicon controlled rectifiers (SCRs), gate turn-off thyristors (GTOs) and insulated-gate transistors (IGTs). The FET and the IGT are preferred devices because of their MOS gating; that is, these MOS devices may be controlled using relatively low currents due to their high input impedance.

Current sensor means comprises, for example, a small sensing resistor 64–67, respectively, in series with each phase winding, respectively. Other suitable current sensors are well known in the art, such as: Hall effect current sensors; sensing resistors; sensing transformers; and current sensing transistors.

Phase current regulation will now be described with reference to motor operation during the conduction interval of the motor phase comprising phase windings 16a and 16b, hereinafter referred to as Phase I. Assume that the phases including windings 24a, 24b, 26a, 26b, 28a, and 28b are held off by applying low logic level signals to the gates of semiconductor switches 31–33 and 35–37, while the signals applied to the gates of semiconductor switches 30 and 34 are high, thus activating Phase I. Voltages $V_2$, $V_3$ and $V_4$ are relatively high, while voltage $V_1$ is a much lower voltage following the on-state voltage drop of FET 34 plus the voltage drop of sensing resistor 64. The FET voltage drop is approximately the instantaneous drain current multiplied by the characteristic on-state resistance of the FET ($R_d$). Thus, $V_1$ is proportional to the instantaneous phase current $I_1$ of the conducting phase. Alternatively, the current-proportional voltage signal, $V_1$, may be generated by any of several other devices, such as the aforementioned Hall effect current sensors.

Figure 3:
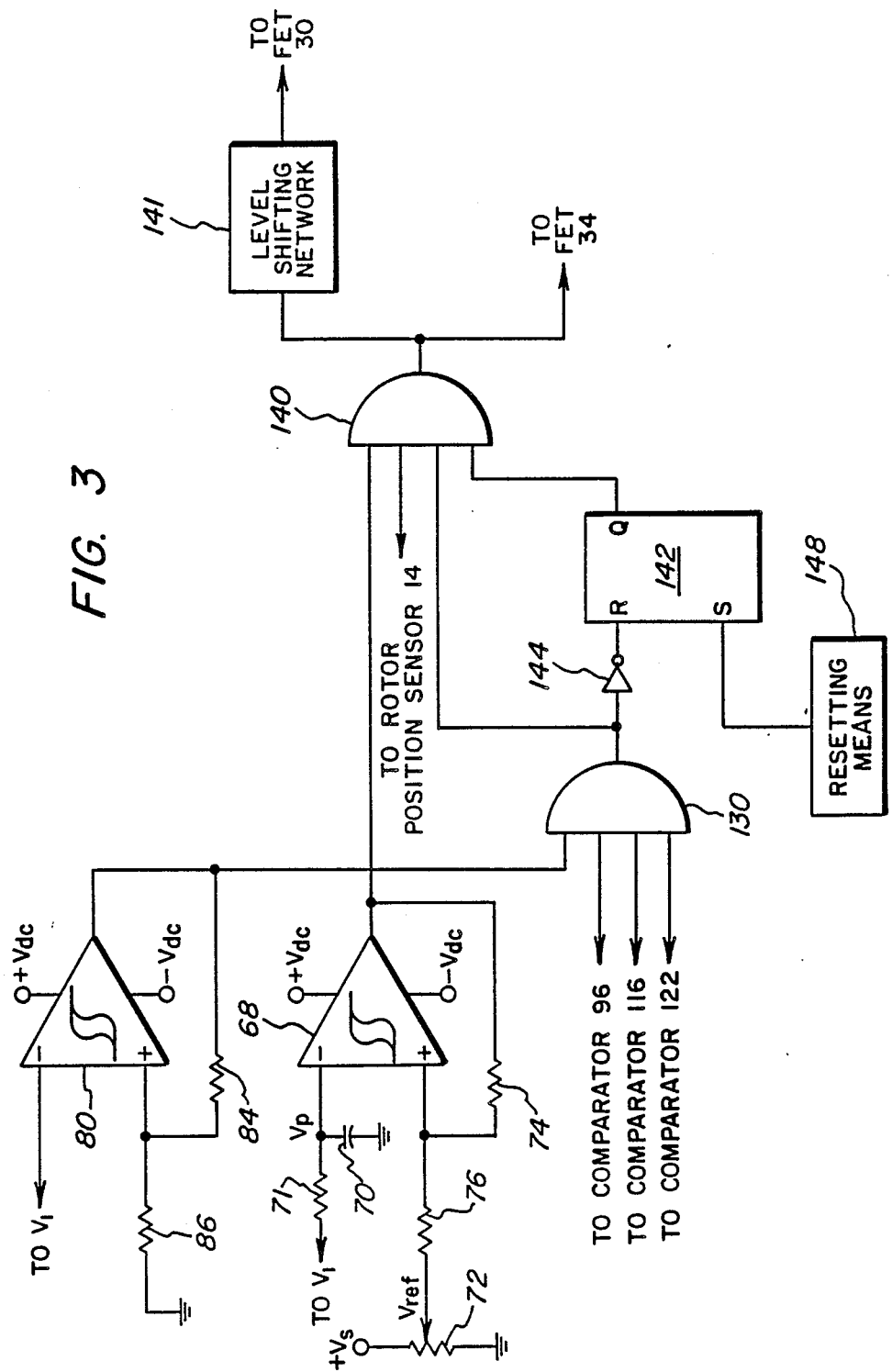
FIG. 3 is a schematic illustration of a phase control circuit for one motor phase of the preferred embodiment of the present invention.

FIG. 3 illustrates the phase control logic circuit for Phase I. The control circuit of FIG. 3 is incorporated into switched reluctance control means 22, illustrated in FIG. 1. Capacitance 70 and resistance 71 comprise a filter for filtering the voltage $V_1$. Thus, $V_p$ is a filtered voltage proportional to the instantaneous phase current $I_1$ of the conducting motor phase. Potentiometer 72 sets a reference signal $V_{ref}$ at the noninverting input of comparator 68. The reference signal $V_{ref}$ controls the average value of the phase current during the conduction interval.

Comparator 68 is preferably an integrated circuit component such an LM311 device manufactured by the National Semiconductor Corporation. The voltages $+V_{dc}$ and $-V_{dc}$ for supplying power to the comparator are provided by a positive low voltage power supply and a negative low voltage power supply, respectively, or by a single low voltage power supply having positive and negative outputs. To provide the comparator hysteresis characteristic, a relatively large resistance 74 is in the feedback path between the output and the noninverting input of comparator 68 and functions with resistance 76 as a voltage divider. For a particular value of $V_{ref}$, the amount of feedback voltage or current at the noninverting input has one of two values, depending upon whether the comparator output is high or low. The changing sensed current, which is proportional to $V_p$ at the inverting input of the comparator, is alternately compared with the two aforementioned reference signal control band limits. When the upper band limit is achieved, the comparator generates a low logic level signal to the control circuitry which deactivates the upper and lower FETs of the respective motor phase. Some types of current sensors, such as sensing resistors 64–67 in FIG. 2 or SENSE FETs, provide no signal $V_1$ when the lower FET, such as FET 34 is open. In such case, comparator 68 is reset by an auxiliary circuit (not shown) after a fixed time interval. However, when other types of current sensors are employed, such as Hall effect current sensors, the upper and lower FETs are reactivated by a high logic level signal each time the lower band limit is reached during the conduction interval. In any case, variation of the phase current between the upper and lower band limits during the phase conduction interval is hereinafter referred to as phase current chopping.

In accordance with the present invention, the current sensing means is also used to detect an abnormally high phase current, or overcurrent, that can result from a fault condition. To this end, a comparator 80 with hysteresis, which may suitably comprise a LM311 manufactured by National Semiconductor Corporation, is employed. Voltage $V_1$, which is proportional to the instantaneous phase current $I_1$, is connected to the inverting input of comparator 80. The threshold voltage of comparator 80 is determined by resistances 84 and 86 of the feedback loop and the comparator voltage corresponding to a high logic level. When voltage $V_1$ exceeds the threshold voltage, the comparator output voltage changes to a low logic level, thus indicating an overcurrent as the result of a fault. In this regard, the threshold of comparator 80 should be set so that the comparator would not generate a low logic level signal for the greatest phase current expected for normal motor operation.

Figure 4:
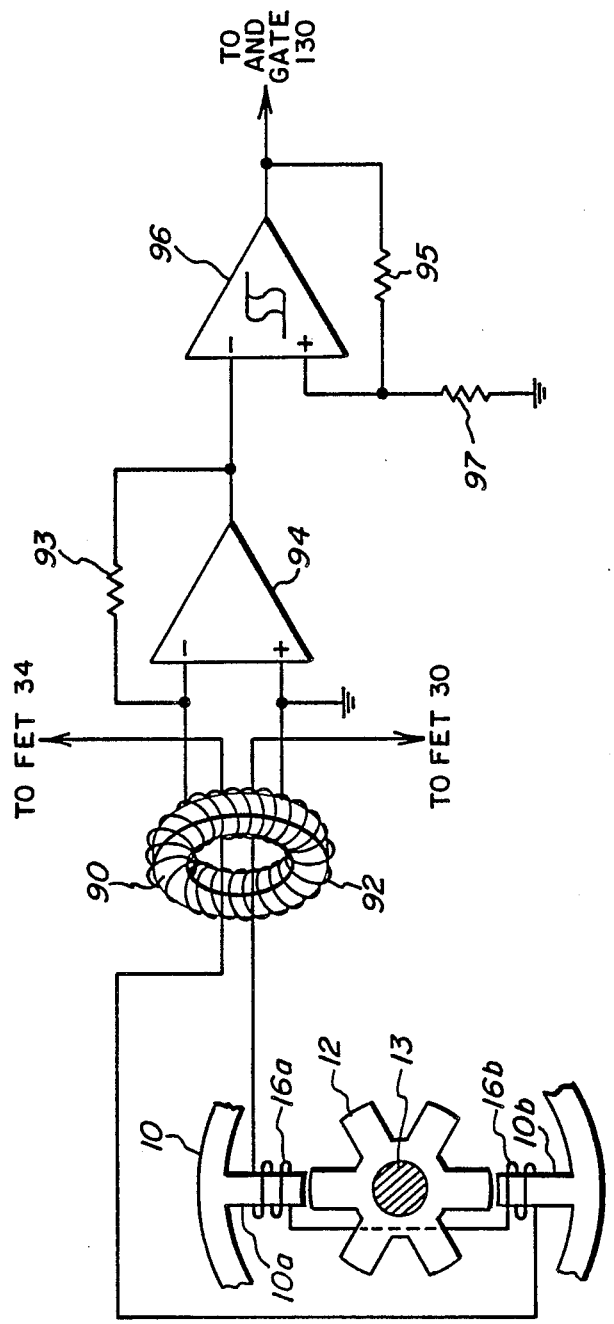
FIG. 4 is a schematic illustration of current differential sensor means according to the present invention.

In FIG. 4, current differential sensor means is shown comprising a toroidal magnetic core 90 surrounding the leads of the corresponding motor phase windings 16a and 16b of Phase I. Phase windings 16a and 16b function as the primary winding of a current differential sense winding pair. The secondary comprises sense winding 92 surrounding core 90. Under normal, no-fault operating conditions, the current in both primary phase winding leads 16a and 16b should be equal; thus, there should be no flux in the core. However, some faults cause the current in the two leads to vary with respect to each other, such as ground faults and phase-to-phase short circuits. Such faults induce flux in core 90 which in turn yields a current in sense winding 92. The sense winding is coupled to linear inverting amplifier 94 including feedback resistance 93 which effectively converts the sensed current to a proportionate voltage. A hysteresis comparator 96 having a feedback loop comprised of resistances 95 and 97, such as comparator 80 discussed above, produces a low logic level output voltage indicative of the fault condition.

Figure 5:
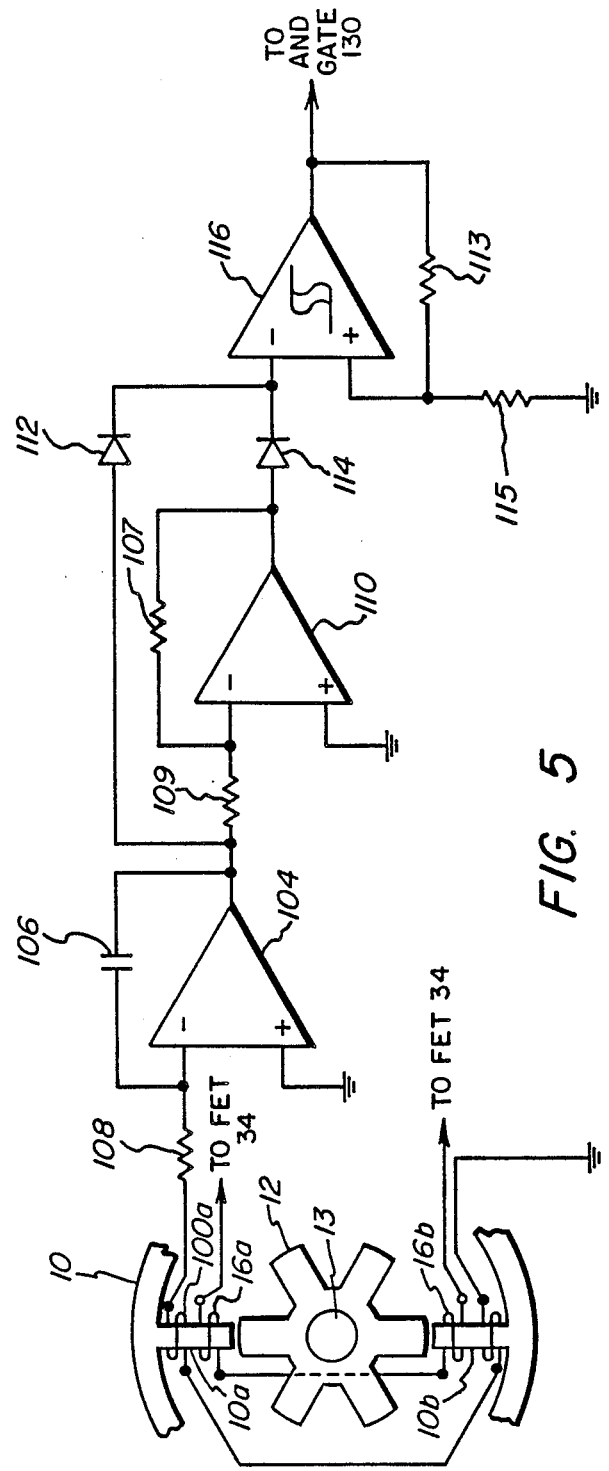
FIG. 5 is a schematic illustration of flux differential sensor means according to the present invention.

In FIG. 5, the preferred apparatus comprising the flux differential sensor means is illustrated, for example, coupled to Phase I of the motor. The flux differential sensor means is the magnetic dual of the differential current sensor means and comprises a flux differential sense coil pair 100a and 100b including a few turns of fine wire around each stator pole of Phase I, the differential sense coil pair being connected in series opposition. As long as the flux in each stator pole of the respective motor phase is the same, there is no voltage drop across the sense coil pair. However, when a fault condition causes the flux in the respective stator poles to differ, a voltage is detected across the sense coil pair. Faults detectable by the flux differential sensor means are shorted turns, ground faults and phase-to-phase faults. An integrator 104 including a capacitance 106 and a resistance 108 in the feedback loop is coupled to the sense coil pair for producing a voltage proportional to the sensed flux difference. Since the rate of change of induced flux may be positive or negative, depending upon which pole of the respective motor phase experiences the fault, an inverting unity-gain amplifier 110 having equivalent-sized resistances 107 and 109 in the feedback loop and a diode OR gate combination is used to ensure that such a fault in either phase is detected. Diodes 112 and 114 comprise the diode OR gate. If, for instance, the detected signal is positive, the signal will take the upper path through diode 112 to the inverting input of hysteresis comparator 116. On the other hand, if the detected signal is negative, the signal will be inverted by unity gain amplifier 110 and will be fed to the inverting input of comparator 116 as a positive signal through diode 114. The comparator then indicates the presence of a fault by producing a low logic level signal at its output. Once again, comparator 116 is a hysteresis comparator such as comparator 80 and has resistances 113 and 115 in the feedback loop to function as a voltage divider.

An alternative method to the flux differential sensor means for detecting shorted phase windings or turns involves a measurement of stator pole inductance. A variation in stator pole inductance indicates the presence of such a fault. The preferred method is to measure the incremental inductance, although a measurement of total inductance could similarly be used. One way to measure incremental inductance is to measure the phase current chopping frequency, since it is a function thereof. That is, phase current chopping frequency increases when there exists a short-circuit of one or more turns of a phase winding. Therefore, a consistently higher than average chopping frequency over a predetermined time interval can be interpreted as a short circuit of one or more turns of a respective phase winding. Additionally, the extent of the increase in chopping frequency is indicative of fault severity.

Figure 6:
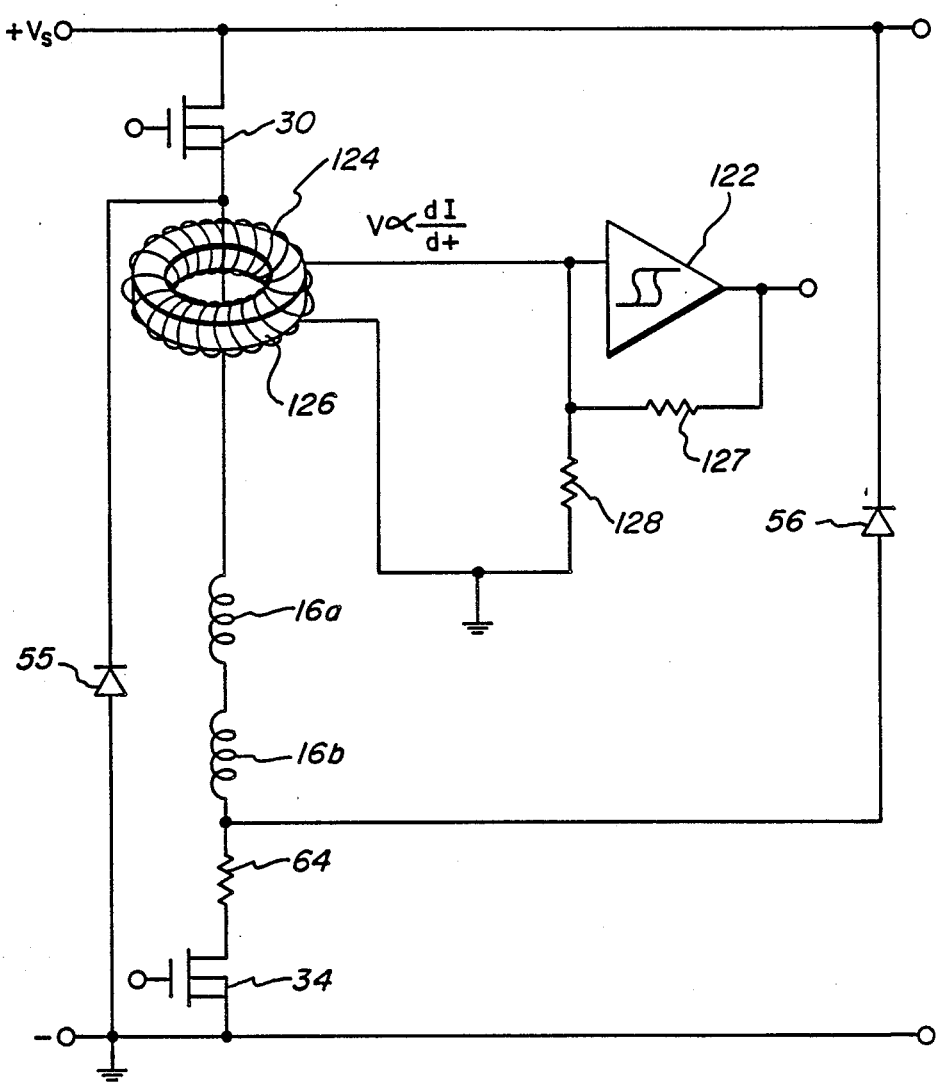
FIG. 6 is a schematic illustration of rate-of-rise sensor means according to the present invention.

According to the present invention, another sensor means, referred to as the rate-of-rise sensor means and illustrated in FIG. 6 as coupled to motor Phase I, may be employed to detect the same faults as the flux differential sensor means and, therefore, may be used in lieu thereof. In addition, however, the rate-of-rise sensor means is useful for detecting phase faults wherein the entire phase winding is short-circuited. Therefore, in the preferred embodiment, the rate-of-rise sensor means is employed in conjunction with the flux differential sensor means.

Operation of the rate-of-rise sensor means is based upon the fact that the initial rate-of-rise of a phase current is the ratio of the DC source voltage to the respective winding inductance. If a motor fault exists such that a portion of a phase winding is bypassed, either by a turn-to-turn short circuit or a short circuit to ground, then the effective circuit inductance is decreased and the initial rate-of-rise of the phase current is abnormally high.

The rate-of-rise sensor means comprises a linear magnetic coupler and a comparator 122. The magnetic coupler comprises a winding 124 uniformly distributed around a toroidal core 126 which surrounds the current path for the respective motor phase winding. The core is comprised of either a non-magnetic material or a low-permeability material having a linear magnetic characteristic. In the case of a fault detectable by rate-of-rise sensor means, a voltage is induced across winding 124 which is proportional to the rate of change of current passing through it. The output of the magnetic coupler is connected to hysteresis comparator 122. The threshold of the comparator is determined by the resistances 127 and 128 of the feedback loop and the comparator voltage corresponding to a high logic level. When the winding output voltage exceeds the threshold voltage, the comparator output voltage changes to a low logic level. The threshold of the comparator should be set so that the comparator will not generate a low logic level signal, thus indicating a fault, for the greatest rate-of-rise of phase current expected for normal operation of the motor, which is generally the ratio of the DC source voltage to the inductance of a phase in its maximum reluctance position.

With reference to the control logic circuit of Phase I illustrated in FIG. 3, the output of each of the above described current sensor means, current differential sensor means, flux differential sensor means, and rate-of-rise sensor means comprise inputs to a first four-input AND gate 130, hereinafter referred to as the fault detection AND gate. Thus, if a fault is detected by any of the above listed sensor means, a low logic level signal will be provided to the respective input line(s) of the fault detection AND gate. The output voltage of AND gate 130 in case of a fault is, therefore, a low logic level.

The output of the fault detection AND gate comprises one of the inputs to a second four-input AND gate 140 in the control circuit, hereinafter referred to as the phase drive AND gate. When the output of the phase drive AND gate is a high logic level, the upper and lower switches comprising FETs 30 and 34, respectively, of motor Phase I are turned on. These switches, and hence Phase I, are off when the output of this AND gate is a low logic level. Further, with regard to the upper FET switch 30, a level shifting network, such as the IR2110 bridge driver manufactured by International Rectifier, is employed to ensure proper gating.

Another input to the phase drive AND gate is from rotor position sensor 14 shown in FIG. 1. The rotor position sensor provides firing signals to converter 18 for energizing the phase windings in a predetermined sequence. Hence, a high logic level is provided to AND gate 140 during the conduction interval of Phase I.

The output of comparator 68 of the current sensor means is another input to phase drive AND gate 140. A low logic level signal is fed to AND gate 140, thus turning off FETs 30 and 34, when the phase current exceeds the aforementioned upper band limit. When the phase current falls to the lower band limit, a high logic level signal is fed to AND gate 140, thus reactivating motor Phase I.

A fourth input to AND gate 140 is from RS flip-flop 142. The output signal of fault detection AND gate 130 is inverted by inverter 144 and is fed to the R input of the flip-flop. The Q output signal of the flip-flop ensures that the output signal of phase drive AND gate 140 remains low after fault detection, even after the output signals of the comparators which comprise the inputs to fault detection AND gate 130 return to a high logic level. Therefore, the faulted phase will remain deactivated until the flip-flop is reset by flip-flop resetting means 148. The flip-flop resetting means may be manually controlled or automatically controlled by a microprocessor which, for example, resets the flip-flop after a predetermined time.

Figure 7:
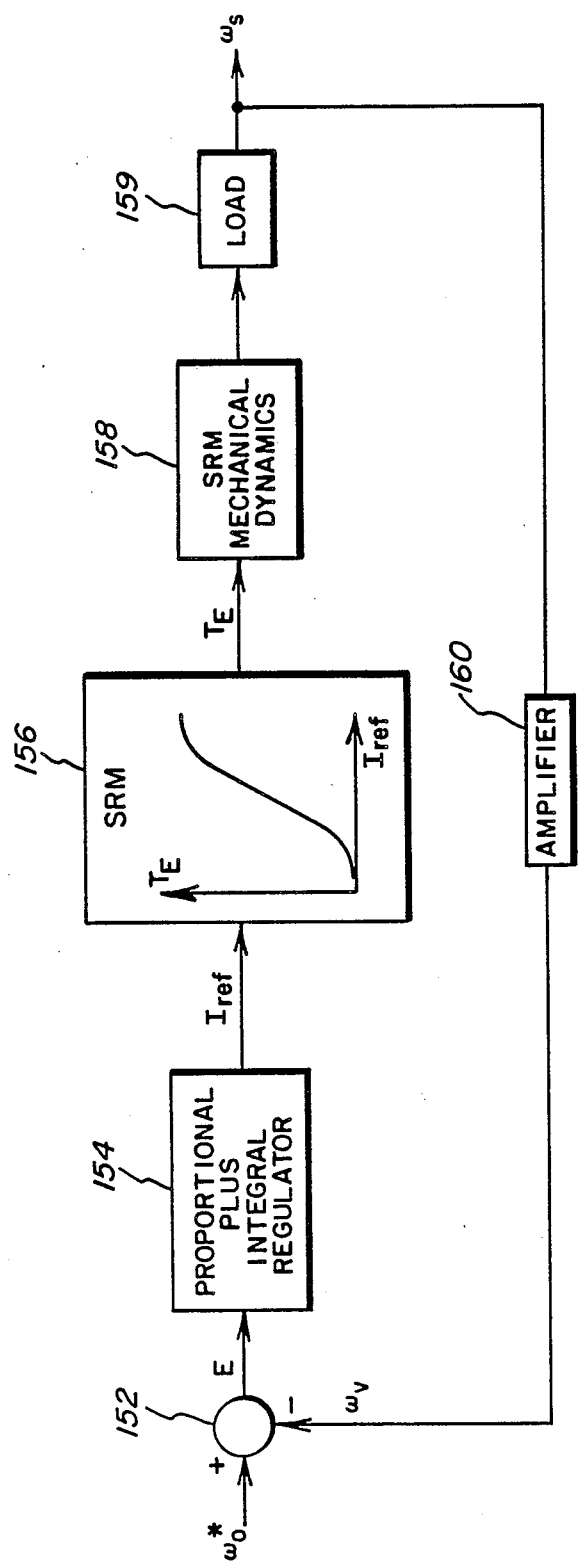
FIG. 7 is a block diagram illustrating the speed controller of the present invention.

The preferred embodiment of the present invention further comprises closed-loop speed control means for maintaining the normal operating speed of the motor, even after faulted phase(s) are deactivated. The speed control means are illustrated schematically in FIG. 7. A speed indicator, such as a tachometer or the like, coupled to the switched reluctance motor provides an instantaneous speed signal $\omega_s$ which is converted by an amplifier circuit 160 to a proportional voltage signal $\omega_v$ comprising one input to a summer 152. The proportional voltage signal is compared in summer 152 to commanded voltage signal $\omega_o^*$, which is proportional to the normal operating speed of the motor, to generate an error signal E. The error signal E is passed through a proportional plus integral regulator 154. The output current $I_{ref}$ of regulator 154 is proportional to the aforementioned reference voltage signal $V_{ref}$ that controls the average value of a phase current during its conduction interval. The electromechanical torque $T_E$ of a switched reluctance motor is related to the current $I_{ref}$ by the nonlinear relation illustrated in block 156 of FIG. 7. The electromechanical torque $T_E$ applied to the mechanical dynamics of the motor and its load, represented by blocks 158 and 159, respectively, determine the operating speed. When the instantaneous motor speed falls below the normal operating speed of the motor, due to loss of a phase by fault detection, then proportional plus integral regulator 154 acts to increase the current $I_{ref}$, thus increasing torque production by the remaining phases.

In another aspect of the present invention, a method is provided for starting the SRM when it is stopped in a "dead zone" created by a faulted phase. As used herein, the term "dead zone" is a region in which positive torque production for rotation in a specified direction cannot be generated by any of the intact phases. However, the intact phases can generate negative torque in a dead zone. Hence, according to the present invention, if the rotor is stopped in a dead zone, one or more intact phases are used by control means 22 to generate negative torque, thereby rotating the SRM in the direction opposite to the specified or desired direction for a short time until the rotor is outside the dead zone. When the rotor is out of the dead zone, the intact phases are used to generate torque for rotation in the desired direction. Once moving, the rotational inertia of the rotor will carry it through the dead zones of the faulted phase(s).

While the preferred embodiments of the present invention have been shown and described herein, it will be obvious that such embodiments are provided by way of example only. Numerous variations, changes and substitutions will be occur to those of skill in the art without departing from the invention herein. Accordingly, it is intended that the invention be limited only by the spirit and scope of the appended claims.

What is claimed is:

1. A fault management system for detecting faults in a multiphase switched reluctance motor employing unidirectional current excitation from a DC source, each phase of said motor comprising two stator poles and a phase winding having two motor leads for connecting the phase winding in series with at least one respective semiconductor switch, said system further isolating any detected faults so that the faulted motor phases are deactivated and motor operation is continued through the remaining phases, said system comprising:
   a plurality of phase control circuits, said phase control circuits each comprising a respective AND gate coupled to a separate respective semiconductor switch, each AND gate generating a low logic level output signal when a fault is detected in the corresponding motor phase, whereby each motor phase exhibiting a fault is deactivated;
   a plurality of current sensor means, each respective one of said current sensor means coupled to a separate respective semiconductor switch to sense the instantaneous current in the respective motor phase winding, the output of each of said current sensor means, respectively, coupled to an input of the AND gate of the corresponding phase control circuit, each respective one of said current sensor means generating a low logic level output signal to the AND gate of the corresponding phase control circuit whenever the respective instantaneous phase current exceeds a regulated current limit; and
   a plurality of current differential sensor means, each respective one of said current differential sensor means coupled to a separate respective motor phase winding for detecting any difference in current flow between the two leads of each respective phase winding of the corresponding phase, the output of each of said current differential sensor means, respectively, coupled to an input of the AND gate of the corresponding phase control circuit, each respective one of said current differential sensor means generating a low logic level signal output to the AND gate of the corresponding phase control circuit when any difference in current flow between the two leads of each respective phase winding of the corresponding phase is detected.

2. The invention of claim 1, further comprising:
   a plurality of flux differential sensor means, each respective one of said flux differential sensor means coupled to a separate respective motor phase winding for detecting any difference in flux between the two stator poles of each corresponding motor phase, the output of each of said flux differential sensor means, respectively, coupled to an input of the AND gate of the corresponding phase control circuit, each respective one of said flux differential sensor means generating a low logic level output signal to the AND gate of the corresponding phase control circuit when any difference in flux is detected between the two stator poles of the respective motor phase.

3. The invention of claim 1 wherein each of said current differential sensor means comprises:
   a magnetic coupler coupled to the respective phase winding for sensing the instantaneous phase current therethrough; and
   current differential comparator means coupled to said magnetic coupler for comparing the instantaneous phase current to a reference current, the output of said current differential comparator means being coupled to an input of the AND gate of the corresponding phase control circuit.

4. The invention of claim 3 wherein each of said magnetic couplers comprises a substantially toroidal core surrounding the respective phase winding leads, each of said magnetic couplers further comprising a current differential sensor winding wound around the corresponding toroidal core.

5. The invention of claim 2 wherein each of said flux differential sensor means comprises:
   a flux differential sense coil, said flux differential sense coil comprising first and second sense windings wound, respectively, around first and second poles of the two stator poles of the corresponding motor phase, respectively, in series opposition with each other; and
   flux differential comparator means coupled to said flux differential sense coil for detecting any voltage drop across said sense coil, the output of said comparator means being coupled to an input of the AND gate of the corresponding phase control circuit.

6. The invention of claim 1, further comprising a plurality of rate-of-rise sensor means, each respective one of said rate-of-rise sensor means coupled to a separate respective motor phase winding for sensing an abnormally high rate of change of phase current in the corresponding phase winding, the output of each of said rate-of-rise sensor means, respectively, coupled to an input of the AND gate of the corresponding phase control circuit, each respective one of said rate-of-rise sensor means generating a low logic level signal output to the AND gate of the corresponding motor phase when an abnormally high rate of change of the respective phase current is sensed.

7. The invention of claim 6 wherein each of said rate-of-rise sensor means comprises:
a magnetic coupler coupled to the respective phase winding for sensing the instantaneous phase current therethrough; and
rate-of-rise comparator means coupled to said magnetic coupler for comparing the instantaneous phase current to a reference current, the output of said rate-of-rise comparator means being coupled to an input of the AND gate of the corresponding phase control circuit.

8. The invention of claim 7 wherein each of said magnetic couplers comprises a substantially toroidal core surrounding the respective phase winding, each of said magnetic couplers further comprising a rate-of-rise sensor winding wound around said core.

9. The invention of claim 2, further comprising a plurality of rate-of-rise sensor means, each respective one of said rate-of-rise sensor means coupled to a separate respective motor phase winding for sensing an abnormally high rate of change of phase current in the corresponding phase winding, the output of each of said rate-of-rise sensor means, respectively, coupled to an input of the AND gate of the corresponding phase control circuit, each respective one of said rate-of-rise sensor means generating a low logic level signal output to the AND gate of the corresponding motor phase when an abnormally high rate of change of the respective phase current is sensed.

10. The invention of claim 1 wherein each of said current sensor means comprises:
a current sensor circuit coupled to the corresponding semiconductor switch for producing voltage signals proportional to the instantaneous phase current of the corresponding motor phase; and
current regulation comparator means coupled to said current sensor circuit for comparing the corresponding instantaneous phase current to said regulated current limit.

11. The invention of claim 10 wherein each said current sensor circuit respectively comprises a sensing resistance in series with the corresponding semiconductor switch.

12. The invention of claim 10 wherein each said current sensor circuit comprises a respective current sensing transformer.

13. The invention of claim 10 wherein each said current sensor circuit comprises a respective current sensing transistor.

14. The invention of claim 10 wherein said current sensor circuit comprises a respective Hall effect current sensor.

15. A multiphase motor drive including a fault management system for detecting motor phase faults and isolating any detected fault by deactivating the faulted motor phase to allow motor operation to continue through the remaining phases, comprising:

a multiphase switched reluctance motor employing unidirectional current excitation, each phase of said motor comprising two stator poles and a phase winding having two motor leads;
an inverter comprising at least one semiconductor switch for each phase of said motor, each semiconductor switch being connected in series with the respective phase winding;
a plurality of phase control circuits, said phase control circuits each comprising an AND gate coupled to the input of the respective semiconductor switch and generating a low logic level output signal when a fault is detected in the corresponding motor phase for deactivating said motor phase exhibiting a fault;
a plurality of current sensor means, each respective one of said current sensor means coupled to a separate respective semiconductor switch to sense the instantaneous current in the respective motor phase winding, the output of each of said current sensor means, respectively, coupled to an input of the AND gate of the corresponding phase control circuit, each respective one of said current sensor means generating a low logic level output signal to the AND gate of the corresponding phase control circuit whenever the respective instantaneous phase current exceeds a regulated current limit; and
a plurality of current differential sensor means, each respective one of said current differential sensor means coupled to a separate respective motor phase winding for detecting any difference in current flow between the two leads of each respective phase winding of the corresponding phase, the output of each of said current differential sensor means, respectively, coupled to an input of the AND gate of the corresponding phase control circuit, each respective one of said current differential sensor means generating a low logic level signal output to the AND gate of the corresponding phase control circuit when any difference in current flow between the two leads of each respective phase winding of the corresponding phase is detected.

16. The invention of claim 15, further comprising:
a plurality of flux differential sensor means, each respective one of said flux differential sensor means coupled to a separate respective motor phase for detecting any difference in flux between the two stator poles of each corresponding motor phase, the output of each of said flux differential sensor means, respectively, coupled to an input of the AND gate of the corresponding phase control circuit, each respective one of said flux differential sensor means generating a low logic level output signal to the AND gate of the corresponding phase control circuit when any difference in flux is detected between the two stator poles of the respective motor phase.

17. The invention of claim 15 wherein each of said current differential sensor means comprises:
a magnetic coupler coupled to the respective phase winding for sensing the instantaneous phase current therethrough; and
current differential comparator means coupled to said magnetic coupler for comparing the instantaneous phase current to a reference current, the output of said current differential comparator means being coupled to an input of the AND gate of the corresponding phase control circuit.

18. The invention of claim 17 wherein each of said magnetic couplers comprises a substantially toroidal core surrounding the respective phase winding leads, said magnetic coupler further comprising a current differential sensor winding wound around the corresponding toroidal core.

19. The invention of claim 16 wherein each of said flux differential sensor means comprises:
   a flux differential sense coil, said flux differential sense coil comprising first and second sense windings wound, respectively, around first and second poles of the two stator poles of the corresponding motor phase, respectively, in series opposition with each other; and
   flux differential comparator means coupled to said flux differential sense coil for detecting any voltage drop across said sense coil, the output of said comparator means being coupled to an input of the AND gate of the corresponding phase control circuit.

20. The invention of claim 15 further comprising a plurality rate-of-rise sensor means, each respective one of said rate-of-rise sensor means coupled to a separate respective motor phase winding for sensing an abnormally high rate of change of phase current in the corresponding phase winding, the output of each of said rate-of-rise sensor means, respectively, coupled to an input of the AND gate of the corresponding phase control circuit, each respective one of said rate-of-rise sensor means generating a low logic level signal output to the AND gate of the corresponding motor phase when an abnormally high rate of change of the respective phase current is sensed.

21. The invention of claim 20 wherein each of said rate-of-rise sensor means comprises:
   a magnetic coupler coupled to the respective phase winding for sensing the instantaneous phase current therethrough; and
   rate-of-rise comparator means coupled to said magnetic coupler for comparing the instantaneous phase current to a reference current, the output of said rate-of-rise comparator means being coupled to an input of the AND gate of the corresponding phase control circuit.

22. The invention of claim 21 wherein each of said magnetic couplers comprises a substantially toroidal core surrounding the respective phase winding, each of said magnetic couplers further comprising a rate-of-rise sensor winding wound around said core.

23. The invention of claim 16, further comprising a plurality of rate-of-rise sensor means, each respective one of said rate-of-rise sensor means coupled to a separate respective motor phase winding for sensing an abnormally high rate of change of phase current in the corresponding phase winding, the output of each of said rate-of-rise sensor means, respectively, coupled to an input of the AND gate of the corresponding phase control circuit, each respective one of said rate-of-rise sensor means generating a low logic level signal output to the AND gate of the corresponding motor phase when an abnormally high rate of change of the respective phase current is sensed.

24. The invention of claim 15 wherein each of said current sensor means comprises:
   a current sensor circuit coupled to the corresponding semiconductor switch for producing voltage signals proportional to the instantaneous phase current of the corresponding motor phase; and
   current regulation comparator means coupled to said current sensor circuit for comparing the corresponding instantaneous phase current to said regulated current limit.

25. The invention of claim 24 wherein each said current sensor circuit respectively comprises a sensing resistance in series with the corresponding semiconductor switch.

26. The invention of claim 24 wherein each said current sensor circuit comprises a respective current sensing transformer.

27. The invention of claim 24 wherein each said current sensor circuit comprises a respective current sensing transistor.

28. The invention of claim 24 wherein each said current sensor circuit comprises a respective Hall effect current sensor.

29. A method for starting a multiphase variable reluctance motor, including a rotor and a stator, when the rotor is stopped in a dead zone created by a faulted phase, said motor having at least one operating phase which, with said rotor in said dead zone, cannot generate sufficient positive torque for rotation in a preselected direction, said method comprising:
   activating the operating phase to generate negative torque for rotation in the direction opposite to said pre-selected direction;
   moving the rotor out of the dead zone; and
   reversing the direction of torque generation by the operating phase, thereby rotating the rotor in the pre-selected direction.

30. A method for detecting and isolating motor phase faults in a multiphase switched reluctance motor, said motor having at least one operating phase through which motor operation is continued, each phase of said motor comprising two stator poles and a phase winding having two motor leads for connecting the phase winding in series with at least one respective semiconductor switch, said method comprising:
   sensing the instantaneous phase current in each respective phase winding;
   comparing each respective instantaneous phase current to a predetermined reference current to detect the current differential between each respective phase current and said predetermined reference current;
   determining whether each respective current differential exceeds a predetermined current differential level; and
   deactivating each corresponding motor phase wherein the respective current differential exceeds said predetermined current differential level.

31. The method of claim 30 wherein said predetermined current differential level is zero.

32. The method of claim 30, further comprising:
   sensing the flux differential between the two respective stator poles of each corresponding motor phase;
   determining whether each respective flux differential exceeds a predetermined flux differential level; and
   deactivating each corresponding motor phase wherein the respective flux differential exceeds said predetermined differential flux level.

33. The method of claim 32 wherein said predetermined flux differential level is zero.

34. The method of claim 30, further comprising: sensing the rate of change of phase current in each respective phase winding;

comparing the rate of change of phase current in each respective phase winding to a predetermined level; and deactivating each corresponding motor phase wherein the respective rate of change of phase current exceeds said predetermined level.

35. The method of claim 32, further comprising:

sensing the rate of change of phase current in each respective phase winding;

comparing the rate of change of phase current in each respective phase winding to a predetermined level; and deactivating each corresponding motor phase wherein the respective rate of change of phase current exceeds said predetermined level.

36. The method of claim 30, further comprising:

sensing the stator pole inductance of each corresponding motor phase by measuring the chopping frequency of the phase current in each respective phase winding;

comparing the chopping frequency in each respective phase winding to a predetermined reference frequency; and deactivating each corresponding motor phase wherein the respective chopping frequency exceeds said predetermined reference frequency.

* * * * *